United States Patent [19]

Kiku

[11] Patent Number: 5,005,106

[45] Date of Patent: Apr. 2, 1991

[54] MULTIFUNCTIONAL CARD HAVING AN ELECTROMAGNETIC WAVE PROTECTION

[75] Inventor: Yutaro Kiku, Yokohama, Japan

[73] Assignee: E. I. Du Pont de Nemours and Company, Wilmington, Del.

[21] Appl. No.: 447,394

[22] Filed: Dec. 7, 1989

[30] Foreign Application Priority Data

Dec. 8, 1988 [JP] Japan .................. 63-159956[U]

[51] Int. Cl.⁵ .............................................. H05K 9/00
[52] U.S. Cl. ............................ 361/424; 174/35 R; 174/35 C; 174/51; 439/607; 439/610
[58] Field of Search ............. 174/35 R, 35 C, 35 MS, 174/51; 361/392, 394, 395, 399, 424; 439/607, 610

[56] References Cited

U.S. PATENT DOCUMENTS

| H526 | 9/1988 | Miller ...................... 174/35 MS |
| 4,593,736 | 6/1986 | Morita ........................ 174/35 R |
| 4,609,104 | 9/1986 | Kasper et al. .............. 174/35 R |
| 4,647,714 | 3/1987 | Goto ............................ 174/35 R |
| 4,872,091 | 10/1989 | Maniwa et al. .................. 361/424 |

FOREIGN PATENT DOCUMENTS 1088408 10/1967 United Kingdom .......... 174/35 MS

Primary Examiner—Gregory D. Thompson

[57] ABSTRACT

A multifunctional card includes a substrate having a semiconductor circuit, and a housing, made of an insulating material, for housing the substrate. The housing comprises two pieces of housing halves to be fitted to contain the substrate therein. In the housing, a sheet-like member constituted by metal and insulating layers put on one another is positioned between the substrate and the housing to cover at least central portion of the substrate with the insulating layer inside. The metal layer is electrically connected to ground portions of the substrate, the ground portions of the substrate being formed so as to contact with a ground portion of a main apparatus.

1 Claim, 2 Drawing Sheets

MULTIFUNCTIONAL CARD HAVING AN ELECTROMAGNETIC WAVE PROTECTION

BACKGROUND OF THE INVENTION

1. Field of the Invention

The present invention relates to a multifunctional IC card having an electromagnetic wave protection means.

2. Description of the Related Art

A large number of multifunctional IC cards, such as memory cassettes, currently employ a housing made of a plastic material in consideration of cost or a request from a customer. The plastic housing does not shield an electromagnetic wave as well as metal case. However, no anti-electromagnetic wave countermeasure is usually taken. Furthermore, in a multifunctional IC card or an intelligent card incorporating a semiconductor device such as a CPU integrated circuit (IC) chip, electromagnetic wave noise is generated from clocks operating the CPU. This noise causes a disturbance in a device outside the card. However, no countermeasure against electromagnetic wave noise generated in a card comprising a CPU is taken.

SUMMARY OF THE INVENTION

It is an object of the present invention to provide a multifunctional card having an electromagnetic wave protection means, which can be manufactured at a relatively low cost.

In order to achieve the above object, there is provided a multifunctional IC card comprising a circuit substrate having a semiconductor such as an integrated circuit (IC) chip circuit, and a housing, made of an insulating material, for housing the substrate, wherein the housing comprises two pieces of housing halves to be fitted to contain the substrate therein, in the housing, a sheet-like member constituted by metal and insulating layers put on one another is positioned between the substrate and the housing to cover at least central portions of the substrate with the insulating layer inside, the metal layer being electrically connected to a ground portion of the substrate, the ground portion of the substrate being formed so as to contact with a ground portion of a main apparatus.

The sheet-like member can be formed to a bag-like shape capable of housing the substrate, or a sheet-like shape or a ribbon-like shape arranged so as to cover the upper and lower surfaces of the substrate.

According to the above-described multifunctional card, electromagnetic wave noise internally generated from the card can be shielded by the metal layer, thus preventing disturbances to other devices. Similarly, external electromagnetic wave noise can be shielded by the metal layer, and hence an erroneous operation in the card can be prevented.

Since the sheet-like member has an insulating layer, and the insulating layer is arranged inside, contact between the metal layer and elements and wiring lines on the substrate can be prevented.

When static discharge occurs through a mating portion or a seam between the first and second housing halves of the housing, the static is discharged onto the metal layer. In this case, only the metal layer is charged, and the static does not reach the inside of the card. Once the card has been removed from a main apparatus, the electrostatic charged in the metal layer is subjected to natural discharge. On the other hand, once the card has been connected to the main apparatus, the static charged in the metal layer is discharged onto the main apparatus side because the ground portion in the card is in contact with the ground portion of the main apparatus. As described above, the present invention also comprises an antistatic countermeasure.

As described above, the present invention comprises the sheet-like member in the housing, which has a simple structure, that is, the structure constituted by the metal and insulating layers put on one another, thereby providing a relatively low-cost multifunctional card which can shield internal and external electromagnetic wave noise and prevent an erroneous operation, and which is effective in preventing the static related destruction.

DETAILED DESCRIPTION OF THE PREFERRED EMBODIMENTS

Figure 1:
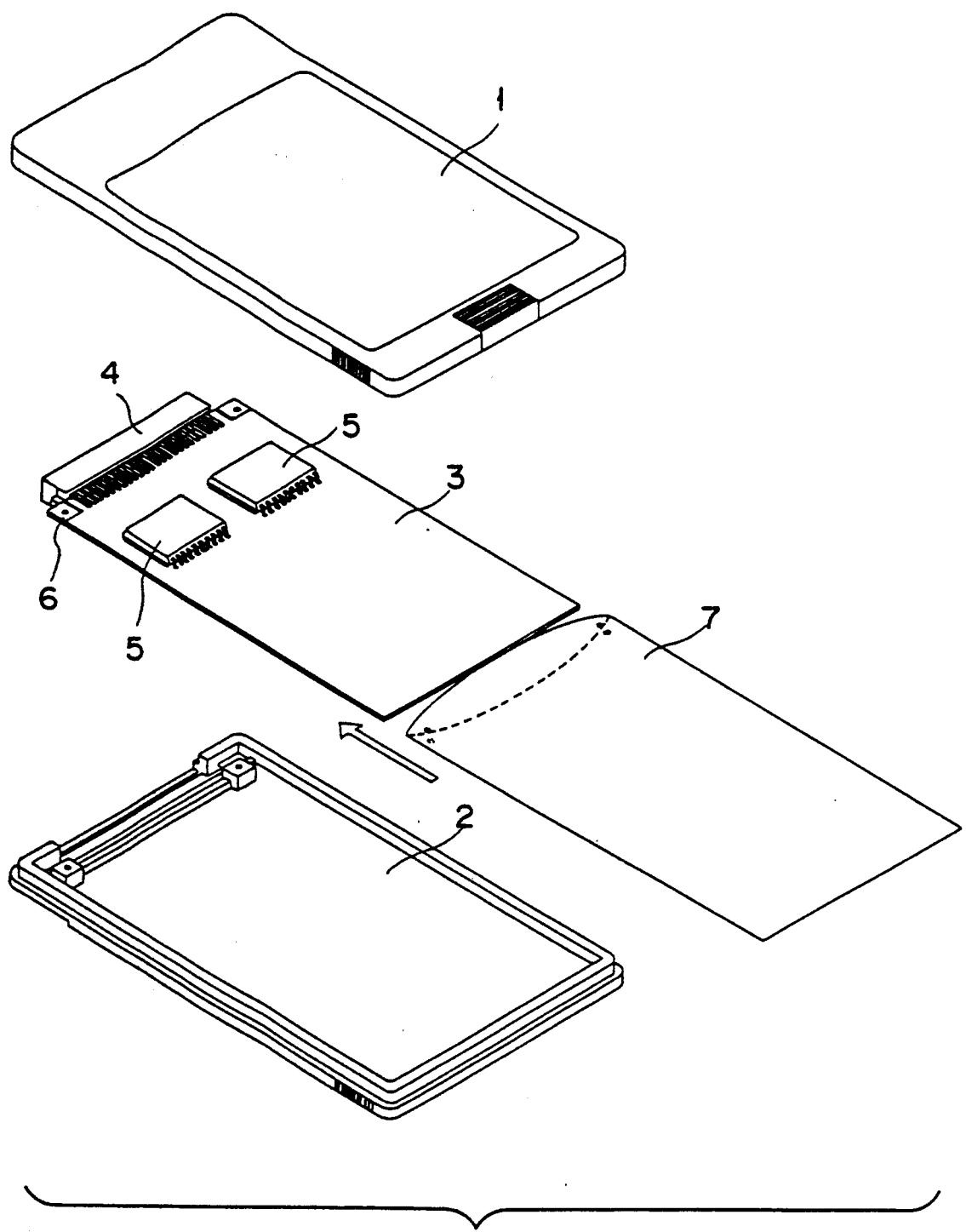
FIG. 1 is an exploded perspective view of a multifunctional card according to an embodiment of the present invention.
Figure 2:
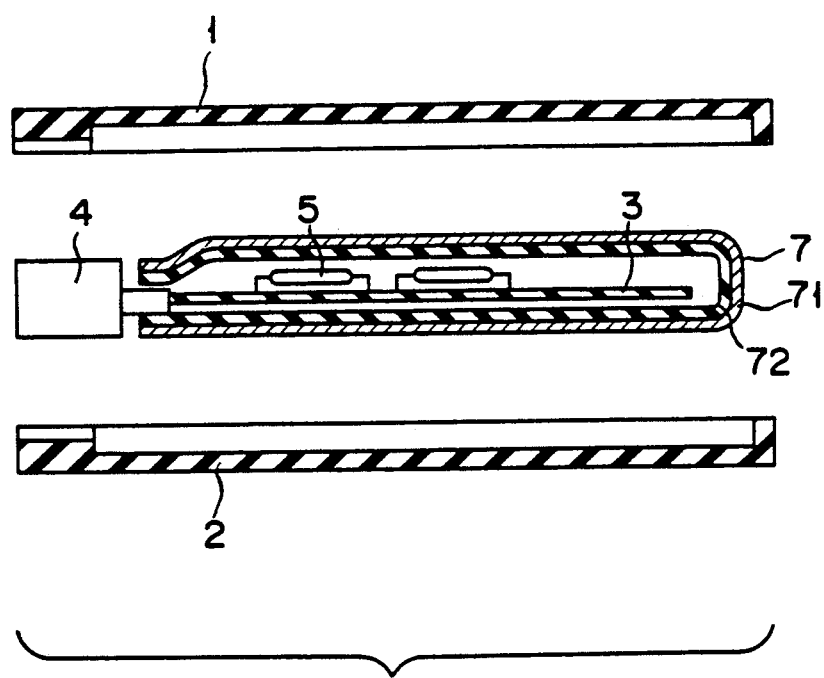
FIG. 2 is an exploded sectional view of the card in FIG. 1.

As shown in FIGS. 1 and 2, a flat housing made of an insulating material, such as plastics, comprises first and second housing halves 1 and 2 which are fitted and constitute upper and lower portions of the housing, and houses a circuit substrate such as a printed circuit board 3. The substrate 3 contained within the housing comprises a connector 4, integrated circuit (IC) chips 5, and ground pads 6 which are formed so as to be brought into contact with ground portions of a main apparatus. A bag-like sheet-like member 7 is constituted by a thin-film member having a two-layer structure consisting of metal and insulating layers 71 and 72 put on one another. For example, the thin-film member is constituted by a layer made of a plastic material, e.g., a thermoelastic material, such as PET (polyethylene terephthalate), and having a surface entirely plated or coated by copper, or a surface having a multilayer plated structure constituted by a lower copper plating layer and an upper nickel plating layer. The sheet-like member 7 houses the substrate 3 while the insulating layer 72 is located inside. The sheet-like member 7 is located between the substrate 3 and the first and second housing halves 1 and 2. Metal portions on the surface of the sheet-like member 7 are connected to the ground pads 6 at the end portions of the opening of the sheet-like member 7, in whatever method suitable Since the insulating layer 72 is located inside, the metal layer 71 is not brought into contact with elements or wiring lines on the substrate 3, and hence a short circuit can be prevented.

A function and effect of the embodiment will be described below. Electromagnetic wave noise generated from a CPU inside the card is shielded by the sheet-like member 7, and hence does not influence other devices outside the card. External electromagnetic wave noise is also shielded by the sheet-like member 7 so that an erroneous operation in the multifunctional card can be prevented.

An antistatic countermeasure will be described below. When static discharge occurs and the charge enters the multifunctional card through the mating portion between the first and second housing halves 1 and 2, with the card already pulled from the main apparatus, the static is discharged onto the sheet-like member 7, and does not reach the substrate inside the card. The charge in the thin-film member is subjected to natural discharged. Similarly, the static generated from a human body and the like upon pulling of the card from the main apparatus is discharged onto the sheet-like member. Since the ground portions of the multifunctional card are connected to the ground terminals of the main apparatus in this state, the static is discharged onto the main apparatus side through the ground pads of the card and the ground portions, thereby protecting the semiconductor circuits on the substrate from the static related destruction.

Since a sheet-like member having a card size can be standardized, the cost can be minimized.

In the embodiment, the bag-like member 7 is used. However, instead of the member 7, a sheet-like or a ribbon-like member constituted by a thin-film member having a two-layer structure consisting of metal and insulating layers can be used. The sheet-like member is used to cover the central portions of the upper and lower surfaces of the substrate with the insulating layer arranged inside. A peripheral portion of the substrate is not covered. In practice, however, most of electromagnetic wave noise entering through the peripheral portion of the substrate can be shielded. In addition, since the static is discharged onto the metal portion near the edge of the sheet-like member, an influence on the elements on the substrate is small. Hence, the sheet-like member can be satisfactorily used in practice.

What is claimed is:

1. A multifunctional IC card comprising
a circuit substrate having mounted thereon at least one integrated circuit device and including a ground means,
a connector means disposed along at least one edge of said circuit substrate for electrically connecting the substrate to an external apparatus,
a housing of two separate sections formed of insulating material which are fit together to enclose the circuit substrate, and
a thin, film-like shielding member having two layers, an inner insulating layer and an outer conductive layer, said shielding member being disposed between the circuit substrate and the housing and surrounding said substrate, said inner insulating layer facing the substrate and said outer conductive layer facing the housing, said conductive layer being electrically connected to said ground means.

* * * * *